May 14, 1963 E. A. GUTBIER 3,089,449

SOLDER APPLYING APPARATUS

Filed June 20, 1960

INVENTOR
E. A. GUTBIER
BY W. J. Johnson
ATTORNEY

United States Patent Office 3,089,449

Patented May 14, 1963

3,089,449

SOLDER APPLYING APPARATUS

Ernst A. Gutbier, Danvers, Mass., assignor to Western Electric Company, Incorporated, New York, N.Y., a corporation of New York Filed June 20, 1960, Ser. No. 37,179
1 Claim. (Cl. 113—94)

This invention relates to apparatus for mounting parts on elongated articles, particularly solder discs on component leads.

In numerous electrical units, wiring boards provide the various wiring circuits for electrical components of the units. Heretofore it has been common practice to mount components on one side of a wiring board and bend the component leads into contact with land areas of the wiring circuits on the other side of the board, subsequently completing the electrical connections through the aid of solder baths. In more recent developments, cavity blocks have been provided for certain of the components and these components are provided with straight leads extending from opposite ends thereof through apertures and land areas of wiring boards mounted on opposite sides of the cavity blocks. This presents a new problem of soldering the straight leads of the components to the land areas of the wiring boards.

An object of the present invention is an efficient and highly practical apparatus for mounting parts on elongated articles.

According to the object, the apparatus comprises a stationary die having a die cavity and an element reciprocable therein to punch a part from a material, which is fed to the die, the element having an aperture therein cooperating with an elongated article to cause punching of an aperture in the part for mounting on the article.

In the present instance, the apparatus includes a die mounted at a fixed position and having a die cavity over which a strip of solder is advanced intermittently relative to the die and an elongated article in the form of a straight lead of an electrical component supported in vertical alignment with the die cavity. The reciprocable element has an outer punch portion cooperating with the die to punch a disc-like solder part from the strip. This element has also an inner die portion larger in cross-section than the cross-sectional contour of the article or component lead to cooperate with the article or lead to punch an aperture in the disc-like part, smaller in diameter than the cross-sectional contour of the article or lead, to cause the part to fit snugly about the lead. The element also has a lateral surface with outwardly flared entrance to the die portion thereof serving to force the apertured part onto the lead and into close engagement, for example, with a land area of a wiring board.

Other objects and advantages will be apparent from the following detailed description when considered in conjunction with the accompanying drawing wherein.

Figure 1:
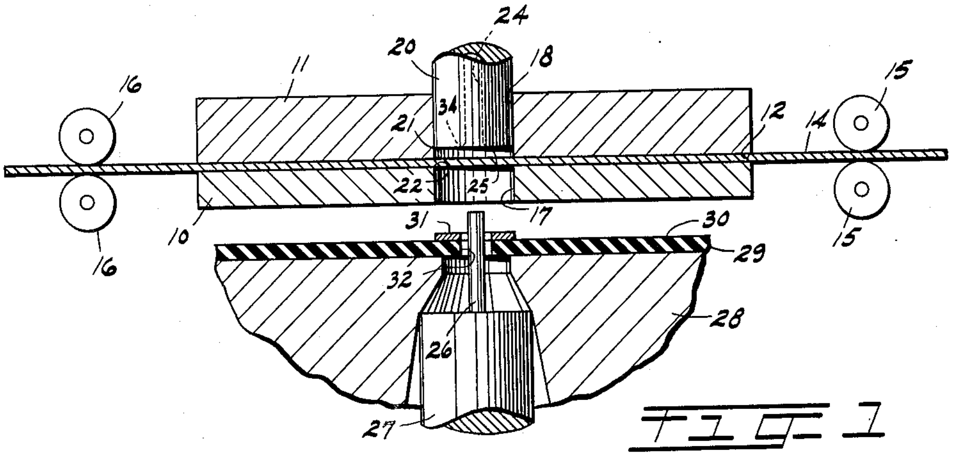
FIG. 1 is a vertical sectional view of the apparatus shown in open position.

The apparatus includes a die 10 mounted on a die holder 11 which has a space 12 therein through which a material 14 may be advanced intermittently by driven rollers 15 and guide rollers 16. The die 10 has a die cavity 17 therein disposed in alignment with a guide aperture 18 in the die holder 11. A reciprocable element 20 is mounted for movement in the aperture 18 and is controlled in its movement between the starting position shown in FIG. 1 and the operated position shown in FIG.

2. This element has an outer edge 21 which may be defined as a punch portion as it cooperates with the die cavity, and particularly the upper edge 22 of the die cavity, to punch a part 23 from the material 14. The element 20 has a hollow central portion 24 which serves as a die and a lateral end portion 25 which serves to push the part into a given position.

In the present instance, the disc-like part 23 is to be pushed downwardly over an elongated article 26, the present illustration being a straight lead at one end of an electrical component 27, supported in a cavity block 28, on which is mounted a wiring board 29 having wiring circuits disposed on a surface 30 thereof with apertured land areas 31 disposed at apertures 32 of the board to receive the elongated articles or terminals 26. The article, whether mounted individually or in the assembly shown, is supported by suitable means, not shown, to align it with the die cavity 17 and the die portion 24 of the element 20.

*Operation*

Figure 2:
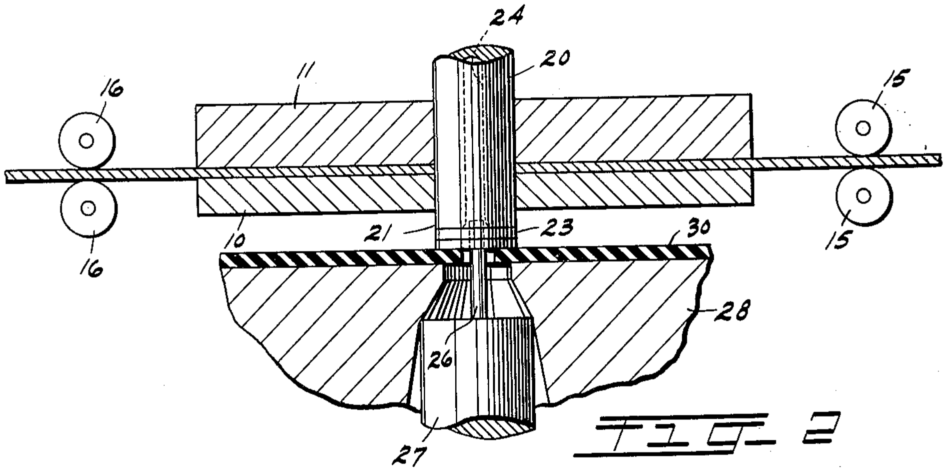
FIG. 2 is a vertical sectional view of the apparatus shown in operated position.

The feeding rolls 15 are operated in synchronism with the means to cause reciprocation of the element 20 so that while the element 20 is in its open or up position, a new length of the material is pulled across the die cavity. While the apparatus is at rest or between operating cycles, the article may be located in its proper position beneath the die cavity so that during the next operating cycle of the apparatus, moving the element 20 from the position shown in FIG. 1 to that shown in FIG. 2, the element 20 will perform three successive operations. The first operation is in cooperation with the die 10 or the die cavity 17 wherein the portions 21 and 22 will cause punching of a disc-like part from the material 14. The second operation of the element 20 is the cooperation of the die portion 24 with the article 26 which occurs intermediate the function of the lateral portion 25 in moving the punched part through the die and relative to the article so that a central portion of the part is punched therefrom.

Figure 3:
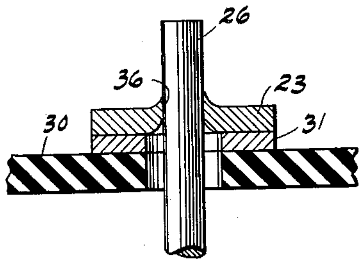
FIG. 3 is an enlarged fragmentary sectional view illustrating the structure of the part mounted on the article.

A rounded entrance end 34 of the die portion 24 in combination with the larger cross-sectional contour of the die portion 24, as compared with the cross-sectional contour of the article 26, will result in the forming of a tight fitting aperture 36, FIG. 3, in the part 23 on the article as a result of the material about the aperture 36 tending to flow into the die portion.

The third function of the element 20 has been described partially, it being the forcing of the part onto the article, causing the perforation of the article to take place, and causing the flow of the material of the part to form the snug fit of the part onto the article. The apparatus will complete its cycle, returning the element 20 to its top position, shown in FIG. 1, so that the material 14 may be advanced for the next operation and another article 26 located in alignment with the die 17 and die portion 24.

It is to be understood that the above described arrangements are simply illustrative of the application of the principles of the invention. Numerous other arrangements may be readily devised by those skilled in the art which will embody the principles of the invention and fall within the spirit and scope thereof.

What is claimed is:

An apparatus for mounting parts on terminals of electrical components extending through land areas of wiring circuits on wiring boards comprising:

a stationary die having a die cavity aligned with a land area of wiring board and a terminal having an end extending therethrough toward the die, means for feeding a strip of solder to the die and die cavity, a reciprocable punch having an end movable between a position spaced from the die and a position beyond the end of the terminal and adjacent to the land area to cooperate with the die cavity to punch a solder part from the strip of solder and move it onto the land area of the wiring board, an inner die cavity disposed in the end of the punch, larger in cross-section than the cross-sectional contour of the terminal and positioned to receive the terminal and cooperate therewith in perforating the solder part, and rounded surfaces extending from the end of the punch into the inner die cavity of the punch to cause solder of the part adjacent the perforation to flow into close engagement with the terminal while the remaining portion of the part moved beyond the end of the terminal is forced by the punch against the land area of the wiring board.

References Cited in the file of this patent

UNITED STATES PATENTS

| | | |
|---|---|---|
| 2,308,606 | Ingerson | Jan. 19, 1943 |
| 2,340,360 | Alden | Feb. 1, 1944 |
| 2,409,615 | Daniel | Oct. 22, 1946 |
| 2,808,636 | Vargo et al. | Oct. 8, 1957 |
| 2,920,595 | Gertz | Jan. 12, 1960 |